(12) United States Patent
Lin et al.

(10) Patent No.: US 11,552,716 B2
(45) Date of Patent: Jan. 10, 2023

(54) ANTENNA MEASUREMENT SYSTEM WITH DISC-SHAPED REFLECTION SURFACE

(71) Applicant: NATIONAL TAIWAN UNIVERSITY, Taipei (TW)

(72) Inventors: Zhao He Lin, Taipei (TW); Hsi Tseng Chou, Taipei (TW); Chih Wei Chiu, Taipei (TW)

(73) Assignee: National Taiwan University, Taipei (TW)

( * ) Notice: Subject to any disclaimer, the term of this patent is extended or adjusted under 35 U.S.C. 154(b) by 17 days.

(21) Appl. No.: 17/307,393

(22) Filed: May 4, 2021

(65) Prior Publication Data

US 2022/0255638 A1 Aug. 11, 2022

(30) Foreign Application Priority Data

Feb. 9, 2021 (TW) .................................. 110105082

(51) Int. Cl.
*H04B 17/11* (2015.01)
*H01Q 19/12* (2006.01)
*H04B 17/10* (2015.01)
*H01Q 19/18* (2006.01)
*H01Q 21/08* (2006.01)

(52) U.S. Cl.
CPC ........... *H04B 17/101* (2015.01); *H01Q 19/18* (2013.01); *H01Q 21/08* (2013.01)

(58) Field of Classification Search
CPC ........ H01Q 19/10; H01Q 19/16; H01Q 19/18; H01Q 21/08; H01Q 19/11; H01Q 19/12; H01Q 19/17; H04B 17/101; H04B 17/10; H04B 17/11; H04B 17/12
See application file for complete search history.

(56) References Cited

U.S. PATENT DOCUMENTS

| 3,936,835 A * | 2/1976 | Phelan .................... H01Q 19/17 343/753 |
| 10,177,434 B1 * | 1/2019 | Sriram ..................... H01Q 3/32 |
| 2017/0214145 A1 * | 7/2017 | Elad ....................... H01Q 19/175 |

FOREIGN PATENT DOCUMENTS

| CN | 103022728 | * 4/2013 | ............... H01Q 1/00 |
| TW | I674416 B | 10/2019 | |
| TW | 201944090 A | 11/2019 | |
| WO | WO-2013011023 A1 * | 1/2013 | ............. H01Q 15/16 |

OTHER PUBLICATIONS

International Patent Office Official Action issued by Foreign Patent Office for corresponding Application No. 11120047880/110105082.

* cited by examiner

*Primary Examiner* — Blane J Jackson
(74) *Attorney, Agent, or Firm* — Rosenberg, Klein & Lee

(57) ABSTRACT

An antenna measurement system includes an array of antennas, an array of reflectors, and a measurement surface. The array of antennas includes a plurality of antenna elements arranged in a straight line; any two adjacent antenna elements in the above antenna elements are separated by a predetermined distance, and each of the antenna elements in the above antenna elements has a radiator and a feed point. The array of reflectors includes at least one reflector and is arranged in a width direction or a height direction, and the array of reflectors is configured to generate a reflection signal according to a signal sent by the array of antennas. An antenna to be measured is configured to perform a measurement operation on the reflection signal on the measurement surface.

9 Claims, 4 Drawing Sheets

ANTENNA MEASUREMENT SYSTEM WITH DISC-SHAPED REFLECTION SURFACE

This application claims priority of Application No. 110105082 filed in Taiwan on 9 Feb. 2021 under 35 U.S.C. § 119; the entire contents of all of which are hereby incorporated by reference.

BACKGROUND OF THE INVENTION

Field of the Invention

The present invention relates to an antenna measurement system, in particular, to an antenna measurement system with parabolic cylinder reflection surface, which is an antenna measurement system with adjustable structure according to actual test requirements.

Description of the Prior Art

As the demand for high-speed wireless data transmission continues to grow, the current 4th generation (4G) communication technology has gradually been unable to meet the demand; therefore, the global mobile communications industry began to invest in the development of the fifth generation (5th generation, 5G) or higher generation technologies. Since the frequency bands above the millimeter wave have the advantage of high transmission rate, phased array antennas above the frequency band with millimeter wave are currently the development focus of related antenna technologies for 5G or higher generations, so that related applications and antenna measurement techniques are extremely important.

However, the existing antenna measurement system requires a lot of space to build a site, and cannot be flexibly adjusted for the measurement facilities that have been erected, so that all kinds of unfavorable factors will increase the cost of manufacturers.

SUMMARY OF THE INVENTION

In summary, an objective of the present invention is to provide an antenna measurement system with parabolic cylinder reflection surface having the advantages of low cost, adjustable distance and adjustable size, so as to solve the above problems.

According to an embodiment, an antenna measurement system includes an array of antennas, an array of reflectors, and a measurement surface. The array of antennas includes a plurality of antenna elements arranged in a straight line; any two adjacent antenna elements in the above antenna elements are separated by a predetermined distance, and each of the antenna elements in the above antenna elements has a radiator and a feed point. The array of reflectors includes at least one reflector, arranged and engaged next to each other along a width direction or a height direction, the array of reflectors being configured to generate a reflection signal according to a signal sent by the array of antennas. An antenna to be measured is configured to perform a measurement operation on the reflection signal on the measurement surface.

According to an embodiment of the present invention, the antenna measurement system further includes the following features: a width or a height of the array of reflectors is adjusted according to the number of a plurality of reflectors in the at least one reflector, and wherein the plurality of reflectors are spliced along the width direction or the height direction, and a total width or a total height of the plurality of reflectors after being spliced are treated as the width or the height of the array of reflectors.

According to an embodiment of the present invention, the antenna measurement system further includes the following features: the array of reflectors presents a reflection parabola in one dimension relative to the array of antennas.

According to an embodiment of the present invention, the antenna measurement system further includes the following features: a height value of the array of reflectors along a height direction is calculated by the following formula:

$$z = \frac{y^2}{4f_y} \quad (1)$$

wherein z is the depth value, y is a height value of the reflection paraboloid along a height direction and $f_y$ is a focal length between the array of antennas and the reflection paraboloid, and wherein the height direction, the width direction and the depth direction are perpendicular to each other.

According to an embodiment of the present invention, the antenna measurement system further includes the following features: the measurement surface has a measurement static zone, and a geometric size of the measurement static zone is greater than or equal to one-half of a geometric size of the measurement surface.

According to an embodiment of the present invention, the antenna measurement system further includes the following features: a distance between the measurement static zone and the reflection paraboloid is 1.5 to 2.5 times $f_y$.

According to an embodiment of the present invention, the antenna measurement system further includes the following features: in the measurement static zone, an amplitude ripple is less than ±0.5 dB and a phase error is less than ±5 degrees.

According to an embodiment of the present invention, the antenna measurement system further includes the following features: the measurement operation includes calculating a radiation field of the array of reflectors according to a RF signal energy generated by each of the antenna elements and determining an optimal amplitude and an optimal phase of the feed point to be fed into each of the antenna elements according to the radiation field.

According to an embodiment of the present invention, the antenna measurement system further includes the following features: the measurement operation further includes dividing the reflection parabola into a plurality of blocks to measure respective radiation fields of the plurality of blocks.

According to an embodiment of the present invention, the antenna measurement system further includes the following features: the array of antennas includes a dielectric substrate and a transmission line, the radiator of each of the antenna elements is arranged on the dielectric substrate, and the feed point of each of the antenna elements is coupled to the transmission line.

According to an embodiment of the present invention, the antenna measurement system further includes the following features: the radiator includes a third conductive portion, a first conductive portion, and a second conductive portion; the first conductive portion is composed of a first extension portion, a first curving portion, and a first bending portion; and the second conductive portion is composed of a second extension portion, a second curving portion, and a second bending portion.

Figure 1A:
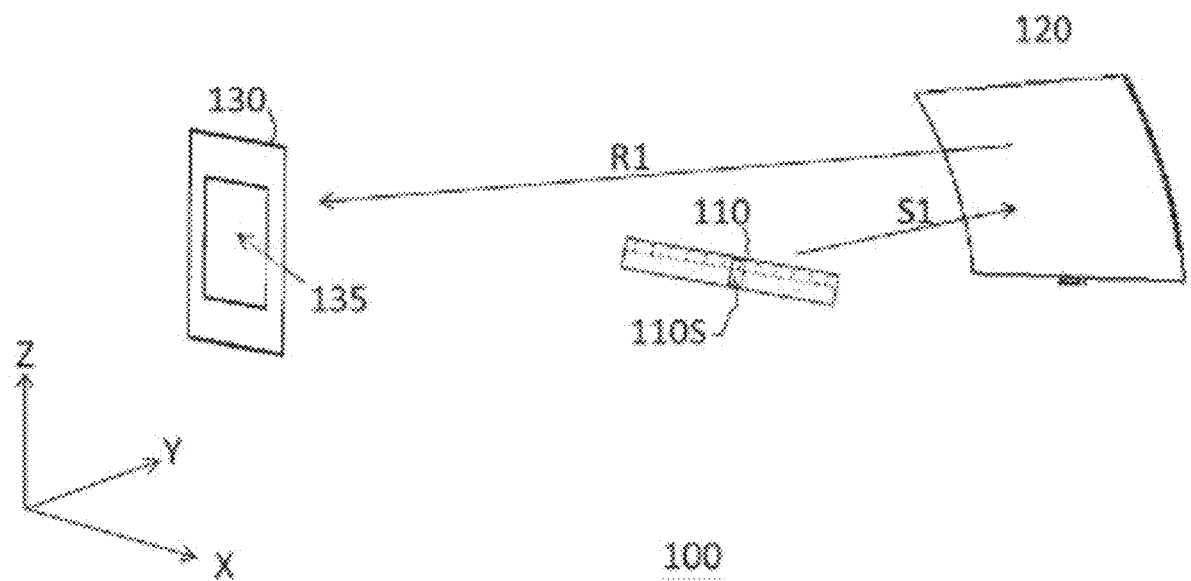
FIG. 1A is a view of an antenna measurement system according to an embodiment of the present invention.

Descriptions of reference numerals: 100—antenna measurement system; 110—array of antennas; 110F—feed point; 110S—antenna element; 120—array of reflectors; 130—measurement surface; 135—measurement static zone; 140—radiator; 141—first conductive portion; 141-1—first extension portion; 141-2—first curving portion; 141-3—first bending portion; 142—second conductive portion; 142-1—second extension portion; 142-2—second curving portion; 142-3—second bending portion; 143—third conductive portion; 145, 146—pattern; 150—transmission line; 160—dielectric substrate; 200 . . . process; 210—robotic arm; 215—measurement component; 220—network analyzer; 610, 620, 710, 720—curved line; P1—scanning path; R1—reflection signal; S1—signal; T1, T2—step.

DESCRIPTION OF THE PREFERRED EMBODIMENTS

The disclosure is described in particular with the following examples, which are only for illustrative purposes, because for those who are familiar with the art, various changes and modifications can be made without departing from the spirit and scope of the disclosure. Therefore, the protection scope of this disclosure shall be subject to those defined by the attached patent application scope. Throughout the specification and the scope of the patent application, unless the content is clearly specified, the meaning of "a" and "the" includes this type of description including "one or at least one" of the element or component. In addition, as used in this disclosure, unless it is obvious from a specific context that the plural number is excluded, the singular article also includes the description of the plural elements or components. Moreover, when applied to this description and the scope of all the following patent applications, unless the content is clearly specified, the meaning of "in it" may include "in it" and "on it." The terms used throughout the specification and the scope of the patent application, unless otherwise specified, usually have the usual meaning of each term used in this field, in the content disclosed here, and in the special content. Some terms used to describe this disclosure will be discussed below or elsewhere in this specification to provide practitioners with additional guidance on the description of this disclosure. The examples anywhere in the entire specification, including the use of examples of any terms discussed herein, are for illustration only, and certainly do not limit the scope and meaning of the disclosure or any exemplified terms. Likewise, the present disclosure is not limited to the various embodiments proposed in this specification.

The terms "substantially", "around", "about" or "approximately" used here should generally mean within 20% of a given value or range. It is preferably within 10%. In addition, the numbers provided here can be approximate, which means that unless otherwise stated, they can be expressed by the words "about", "about" or "nearly". When a quantity, concentration, or other value or parameter has a specified range, a preferred range, or a table with upper and lower ideal values, it shall be regarded as a special disclosure of all ranges constituted by any pairs of upper and lower limits or ideal values, regardless of whether these ranges are disclosed separately. For example, if a certain length of the disclosure range is X cm to Y cm, it should be regarded as the disclosure length is H cm and H can be any real number between X and Y.

In addition, if the term "electrically coupled" or "electrical connected" is used, this includes any direct and indirect electrical connection means. For example, if it is described that a first device is electrically coupled to a second device, it means that the first device can be directly connected to the second device, or indirectly connected to the second device through other devices or connecting means. In addition, if the description is about the transmission and provision of electrical signals, those who are familiar with this skill should be able to understand that the transmission of electrical signals may be accompanied by attenuation or other non-ideal changes; however, if the source and receiving end of the transmission or provision of electrical signals are not specifically stated, they should essentially be regarded as the same signal. For example, if the terminal A of the electronic circuit transmits (or provides) an electrical signal S to the terminal B of the electronic circuit, a voltage drop may be generated through the source and drain terminals of a transistor switch and/or possible stray capacitance. However, if the purpose of this design does not deliberately use the attenuation or other non-ideal changes produced during transmission (or provision) to achieve certain specific technical effects, the electrical signal S should be regarded as substantially the same signal at the terminal A and the terminal B of the electronic circuit.

It is to be understood that the terms "comprising", "including", "having", "containing", "involving", etc. used herein are open-ended, which means including but not limited to. In addition, any embodiment of the present invention or the scope of the patent application does not have to achieve all the objectives or advantages or features disclosed in the present invention. In addition, Abstract and Title are only used to assist in searching for patent documents, not to limit the scope of the patent application of the present invention.

With reference to FIG. 1A, FIG. 1A is a view of an antenna measurement system 100 according to an embodiment of the present invention. The antenna measurement system 100 includes an array of antennas 110, an array of reflectors 120, and a measurement surface 130. The array of antennas 110 includes a plurality of antenna elements 110S arranged in a straight line. The array of reflectors 120 is configured to generate a reflection signal R1 according to the signal S1 emitted by the array of antennas 110, and an antenna to be measured is configured to measure the reflection signal R1 on the measurement surface 130.

Figure 1B:
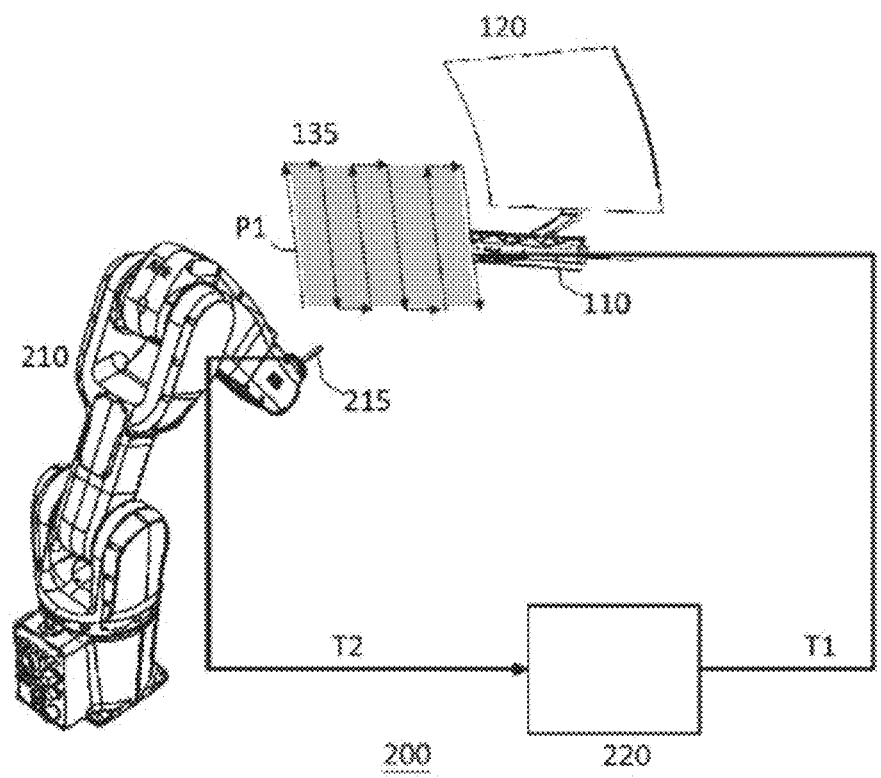
FIG. 1B is a view showing a flow chart of the antenna measurement system of FIG. 1A.

With reference to FIG. 1B, FIG. 1B is a view showing a flow 200 of the antenna measurement system 100 of FIG. 1A, wherein:

A radio frequency (RF) signal is output by a network analyzer 220, is sent to a feed antenna (for example, the array of antennas 110) of the parabolic cylinder reflection surface (for example, the array of reflectors 120) via a RF coaxial cable (as shown in step T1), and then the feed antenna radiates the signal and reflects an energy through the parabolic cylinder reflection surface; subsequently, the antenna to be measured (including the measurement component) on the robotic arm 210 is used to measure the RF signal of a measurement static zone 135 of the measurement surface 130 and output to the network analyzer 220 (as shown in step T2). On the other side, the robotic arm 210 uses the measurement component 215 to scan the static zone 135 for planar scanning (as shown by the scanning path P1, which may be alternately horizontally and vertically), with a scanning way of sending the signal back to the network analyzer 220 and recording the data after receiving the RF energy.

Figure 2:
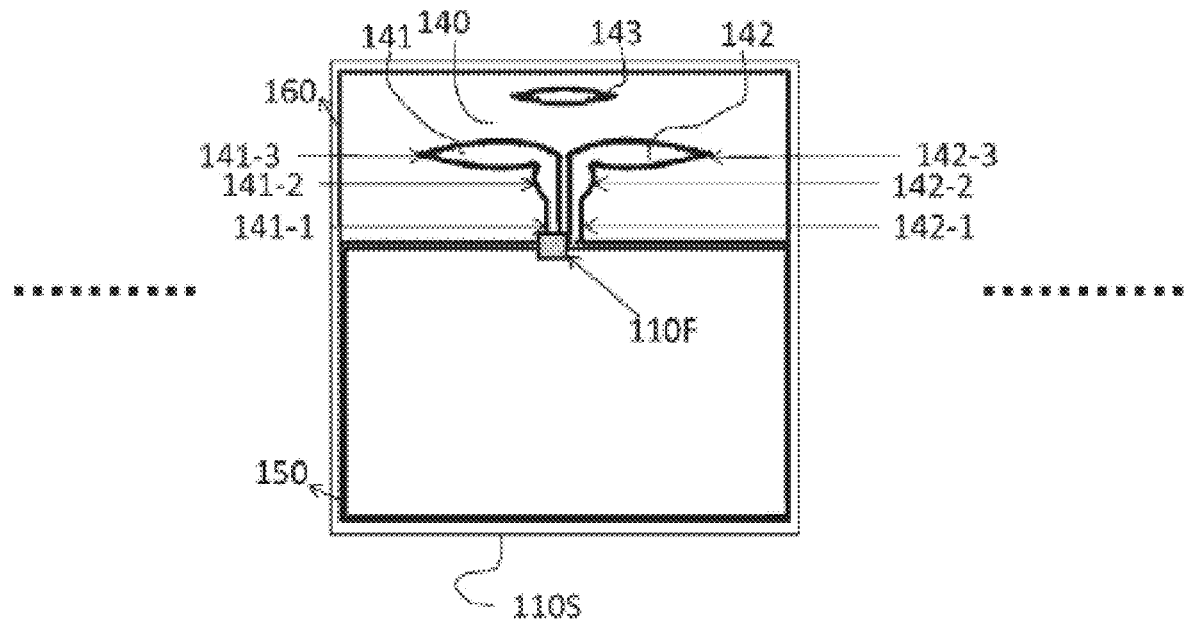
FIG. 2 is a view of an array of antennas applied to the antenna measurement system of FIG. 1A.

FIG. 2 is a view of an array of antennas 110 applied to the antenna measurement system 100 of FIG. 1A. As shown in FIG. 2, the array of antennas 110 includes a dielectric substrate 160 (this component is not a necessary component) and a transmission line 150 (which may be a low frequency transmission line), the radiator 140 of each of the antenna elements 110S is arranged on the dielectric substrate 160, and the feed point 110F of each of the antenna elements 110S is coupled to the transmission line 150, wherein the antenna element 110S is separated from the adjacent antenna element by a predetermined distance, which may be 0.5 times the wavelength of the operating frequency of the antenna measurement system 100, but is not limited by the present invention. In addition, the distance between the aforementioned antenna elements may be a distance from a center point of one antenna element to a center point of the next antenna element.

According to an embodiment of the present invention, the antenna element 110S is, for example, a dipole antenna, and the radiator 140 thereof includes a first conductive portion 141, a second conductive portion 142, and a third conductive portion 143, wherein the third conductive portion 143 may be a guide. The first conductive portion 141 includes a first extension portion 141-1, a first curving portion 141-2, and a first bending portion 141-3; and the second conductive portion 142 includes a second extension portion 142-1, a second curving portion 142-2, and a second bending portion 142-3. In the design where the distance among the dipole antennas is half a wavelength, in order to avoid the bandwidth range being limited by the wavelength, the design of the radiator 140 is that the two wings of the dipole antenna (i.e., the first conductive portion 141 and the second conductive portion 142) adopt a progressively curved profile, which on one hand may reduce the discontinuity of the current and on the other hand help increase the corresponding frequency range, so as to facilitate increasing the bandwidth. In other words, a radiation direction of the dipole antenna adopts a progressively curved profile to help increase the bandwidth and increase the gain.

Figure 3:
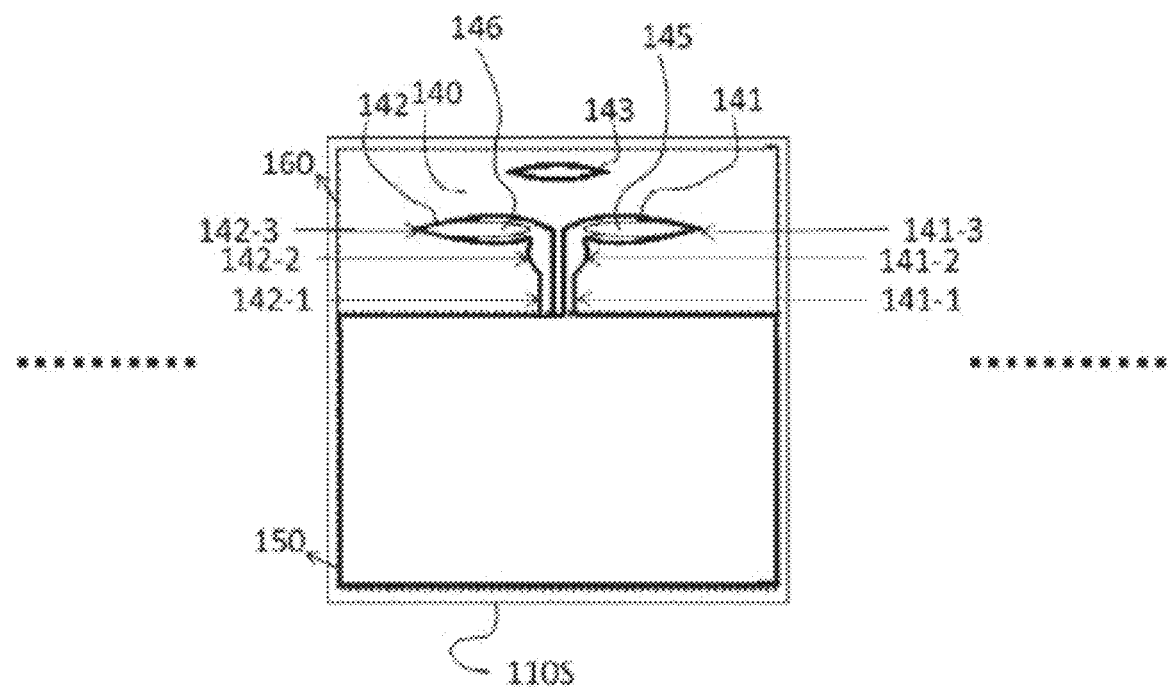
FIG. 3 is a view of a back of the array of antennas of FIG. 2.

With reference to FIG. 3, FIG. 3 is a view of a back of the array of antennas 110 of FIG. 2; the back of the dipole antenna is provided with patterns 145, 146 similar to the outline of the dipole antenna with the material of copper, so that the coplanar dipole antenna will be compensated to produce an asymmetric beam on the vertical antenna plane (H-Plane), and the symmetry of the beam may be improved.

According to an embodiment of the present invention, the dielectric substrate 160 may be a single-layer board and is made of Rogers 4003C. The material of the dielectric substrate 160 may be implemented with a hydrocarbon ceramic laminate. The hydrocarbon ceramic laminate has the characteristics of low loss, low dielectric tolerance (Dielectric Constant: 3.38+/−0.05), and low dissipation factor (Dissipation Factor: 0.0027) with an application frequency up to 70 GHz. The thermal expansion coefficient of Rogers4003C material is similar to that of copper, so it may provide reliable plated through hole quality even at high temperatures. In terms of efficiency, a thickness of the material is designed to be 0.203 mm and the dielectric constant ($\varepsilon r$) of the substrate is designed to be 3.55, up to 30% of operating frequency band may be realized. This thickness also contributes to a very wide beam width on the vertical antenna plane (H-Plane), and a beam width of 140 degrees at −1 dB.

Figure 4:
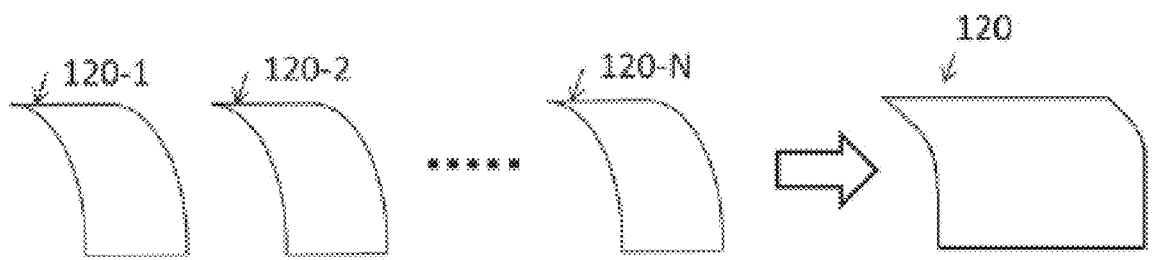
FIG. 4 is a view of width adjustment of an array of reflectors.

With reference to FIG. 4, FIG. 4 is a view of width adjustment of an array of reflectors 120. The array of reflectors 120 includes at least one cylindrical reflector (which presents a dish-shaped reflection surface), i.e., including only one reflector (as shown in FIG. 1A) or be composed of a plurality of reflectors arranged and joined next to each other along a width or height direction. As shown in FIG. 4, the array of reflectors 120 may be composed of a plurality of reflectors 120-1, 120-2 . . . 120-N, and is schematically shown arranged in the width direction, but is not limited to this. According to the above concept, the width of the array of reflectors 120 of the present invention may be adjusted according to the number of reflectors. The reflectors are arranged and joined in a width direction in close proximity, and a total width of the reflectors after being spliced is a width of the array of reflectors 120. For example, these reflectors may be fixed by welding or screw locking and then spliced together. The same concept may also be applied to the extension of the height direction, and the generation of the reflection surface is extended according to the following formula (2).

Moreover, as shown in FIG. 1A, the array of reflectors 120 presents a reflection parabola in one dimension relative to the array of antennas 110; if viewed from the X-axis direction, the reflection parabola presents a parabolic arc on the Y-Z plane; however, the present invention does not limit the curvature of the reflection parabola, and may be adjusted according to actual usage requirements. A depth value of the array of reflectors 120 along a depth direction (e.g., Z-axis direction) is calculated by the following formula:

$$z = \frac{y^2}{4f_y} \qquad (2)$$

wherein z is the depth value of the reflection parabola, y is a height value of the reflection paraboloid along a height direction (e.g., Y-axis direction) and $f_y$ is a focal length between the array of antennas 110 and the reflection paraboloid, and wherein the height direction, the width direction and the depth direction are perpendicular to each other.

Figure 5:
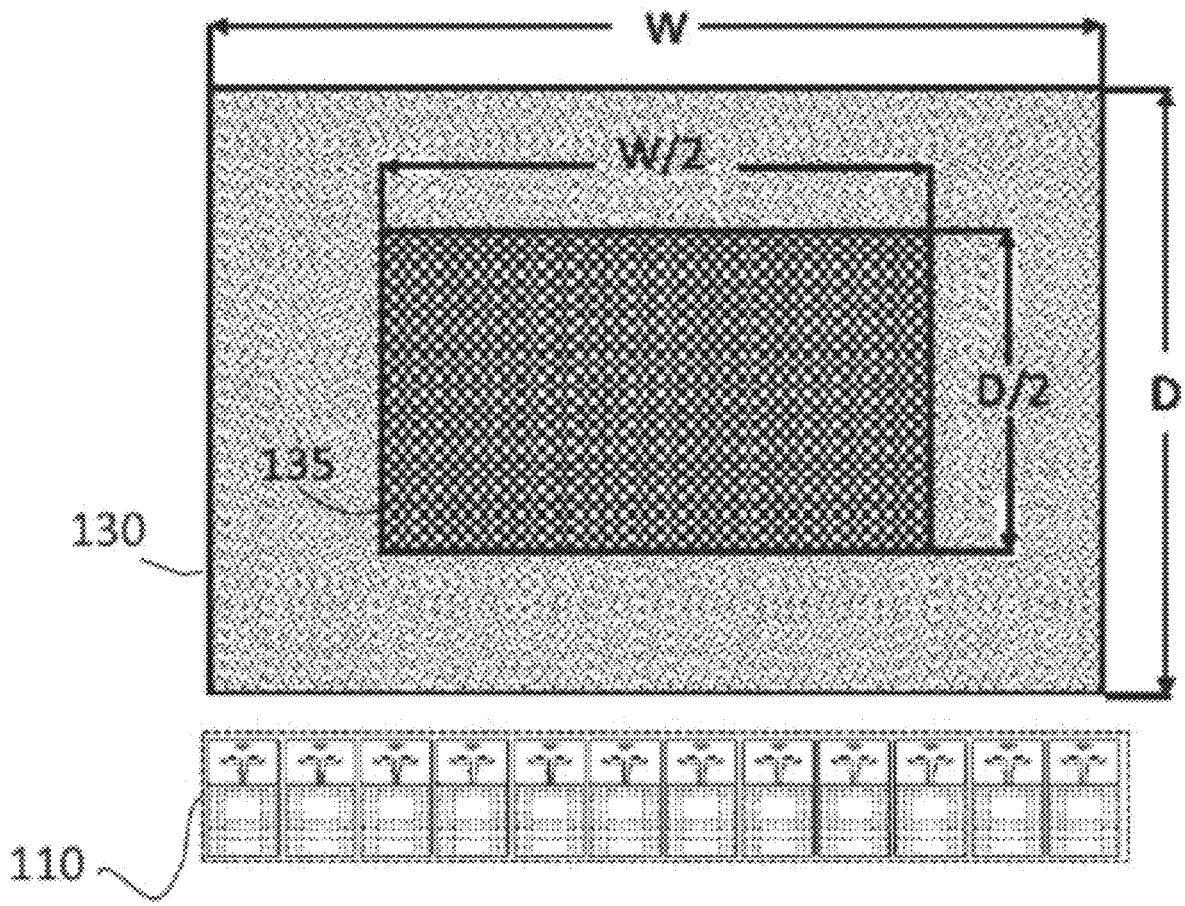
FIG. 5 is a view of a measurement surface applied to the antenna measurement system of FIG. 1A according to an embodiment of the present invention.

With reference to FIG. 5, FIG. 5 is a view of a measurement surface 130 applied to the antenna measurement system 100 of FIG. 1A according to an embodiment of the present invention. The measurement surface 130 has a measurement static zone 135, and a geometric size of the measurement static zone 135 is greater than or equal to one-half of a geometric size of the measurement surface 130, i.e., a side length in the width and height direction of the measurement static zone 135 must be greater than or equal to one-half of a side length of the measurement surface 130

According to the above design, when the size of the static zone is required to be changed, only a vertical height (y-axis direction) of the reflection paraboloid to extend to the height direction while a horizontal width (X-axis direction) using the same reflection paraboloid to splice and expand without redesigning the reflection surface.

Further, a distance between the measurement static zone 135 and the reflection paraboloid is 1.5 to 2.5 times $f_y$. In other words, when the focal length between the array of antennas 110 and the array of reflectors 120 is $f_y$, the distance between the array of antennas 110 and the measurement surface 130 may be approximately 0.5 $f_y$ to 1.5 $f_y$. For example, an amplitude ripple measured by the measurement static zone 135 is less than ±0.5 dB, with a phase error less than ±5 degrees, which is not limited by the present invention.

The measurement surface 130 may calculate a radiation field of the array of reflectors 120 according to a RF signal energy generated by each of the antenna elements 110S in the array of antennas 110 and determine an optimal amplitude and an optimal phase of the feed point 110F to be fed into each of the antenna elements 110S according to the radiation field. In an embodiment, the above-mentioned measurement operation divides the reflection parabola into a plurality of blocks, measures the respective radiation fields of these blocks respectively, and finally obtains the summed and averaged radiation fields.

In summary, the present invention provides an improved telescopic antenna measurement system, which is suitable for building an antenna radiation far-field environment in a narrow space, and greatly improves the accuracy of measurement, so as to meet the requirements of the production line. Moreover, the system of the present invention has a high degree of expansion, in which the width and height of the array of reflectors may be flexibly adjusted, and the cost of the manufacturer may be greatly reduced. In addition, in the present invention, different from the traditional method, the measurement structure adopts a novel reflection parabolic design, which may greatly reduce the cost of the traditional telescopic antenna measurement field (the laboratory building site is greatly reduced, the construction cost is reduced, and the distance is shortened, the RF signal attenuation becomes smaller, and there is no need to add an RF amplifier to amplify the signal). This is because the present invention uses a reflection paraboloid as the reflection surface, and the reflection surface may provide a long-distance effect when the reflection surface is set at a relatively short distance. Further, the present invention is particularly suitable for the measurement of frequency bands above millimeter waves, may greatly reduce the system construction space, and meet the requirements of production lines.

The advantages of the antenna measurement system of the present invention may be summarized as follows:

(1) the feed antenna adopts the type of the array of antennas, the distance between each antenna element may be (but not limited to) 0.5 times the wavelength of the operating frequency of the antenna measurement system, and the physical optics is used to analyze the radiation performance of the reflection surface to calculate the optimal excitation amplitude and phase for each feed antenna element;

(2) according to the requirements for different sizes of the measurement static zone, only the vertical height of the reflection surface is required to be adjusted, and the horizontal width only is required to be spliced and extended with the same reflection surface, without redesigning the entire reflection surface;

(3) the radiator of the antenna element adopts a novel design, which may reduce the discontinuity of the current on the one hand, and help increase the corresponding frequency range on the other hand to increase the bandwidth;

(4) the novel reflection parabolic design enables the antenna measurement system to achieve the desired measurement results without occupying a large area;

(5) the system has a high degree of expansion, especially for the measurement of frequency bands above millimeter waves, which greatly reduces the system construction space, and is especially suitable for production line applications.

Figure 6:
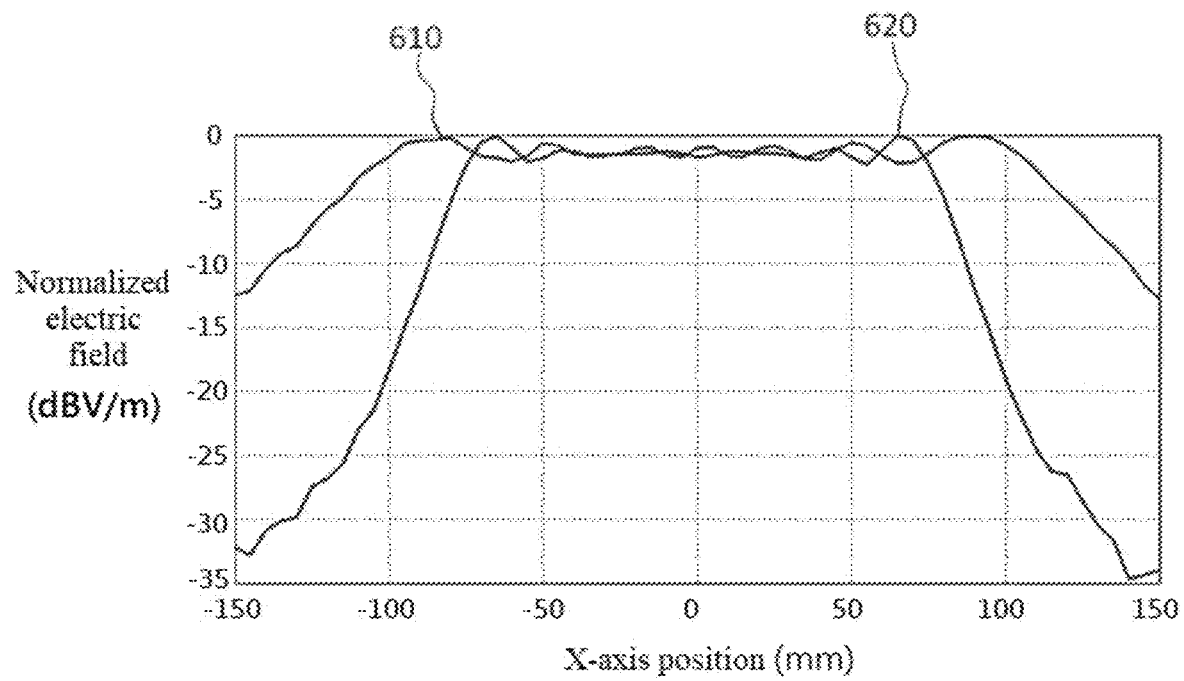
FIG. 6 is a view of the energy distribution of a horizontal cross-section of the radiation field fed into the antenna.
Figure 7:
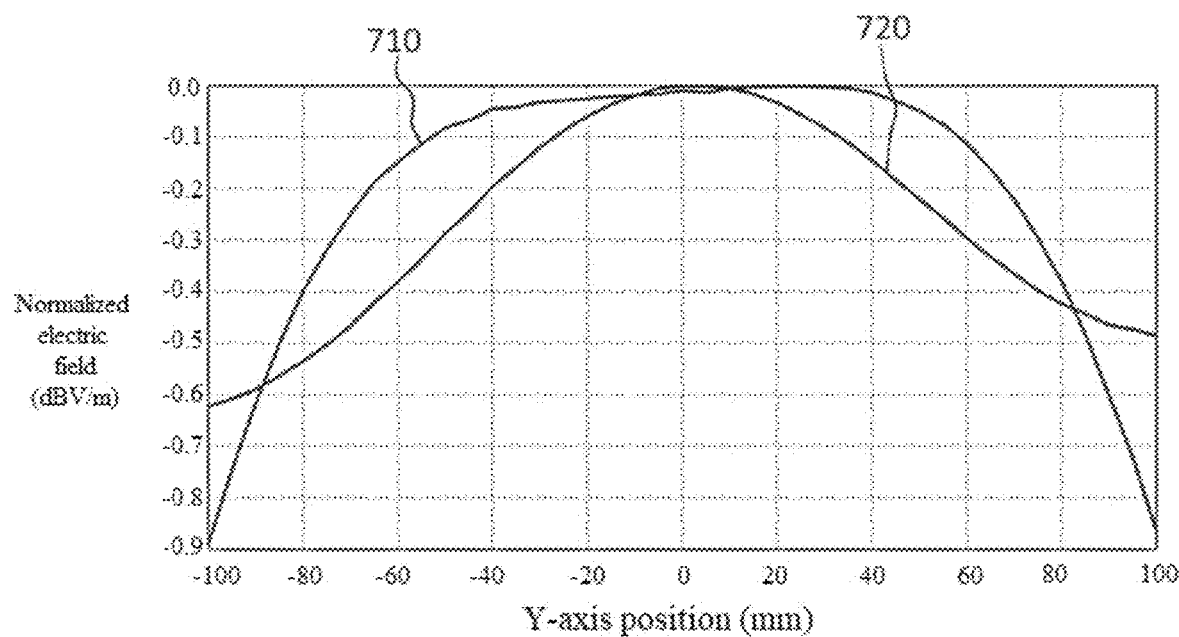
FIG. 7 is a view of the energy distribution of a horizontal longitudinal-section of the radiation field fed into the antenna.

The optimal excitation amplitude and phase of the above-mentioned feed antenna elements may be understood by referring to FIG. 6 and FIG. 7. FIG. 6 is a view of the energy distribution of a horizontal cross-section of the radiation field fed into the antenna, and FIG. 7 is a view of the energy distribution of a horizontal longitudinal-section of the radiation field fed into the antenna, wherein curves 610 and 710 are the electric field distributions for antenna optimization without using the antenna measurement system, and Curves 620 and 720 are the electric field distribution optimized by the antenna measurement system. Comparing the curves 610, 620 (or 710, 720), it can be seen that the amount of variation in the middle part of the curves 620, 720 is significantly smaller, and the energy on both sides is also significantly reduced. When the optimal excitation amplitude and phase of the feed antenna element are not used, the tapers of curves 620 and 720 are significantly lower than those of 610 and 710; therefore, a better measurement range and signal quality may be provided, which is sufficient to prove that the technology of the present invention is indeed sufficient to achieve the above-mentioned effects.

What is claimed is:

1. An antenna measurement system, comprising:
an array of antennas, comprising a plurality of antenna elements arranged in a straight line, any two adjacent antenna elements in the plurality of antenna elements being separated by a predetermined distance, each of the antenna elements in the plurality of antenna elements having a radiator and a feed point;
an array of reflectors, comprising at least one reflector, arranged and engaged next to each other along a width direction or a height direction, the array of the reflectors being configured to generate a reflection signal according to a signal sent by the array of antennas; and
a measurement surface, configured to perform a measurement operation on the reflection signal;
wherein the measurement operation comprises:
calculating a radiation field of the array of reflectors according to a RF signal energy generated by each of the antenna elements; and
determining an optimal amplitude and an optimal phase of the feed point to be fed into each of the antenna elements according to the radiation field.

2. The antenna measurement system according to claim 1, wherein a width or a height of the array of the reflectors is adjusted according to the number of a plurality of the reflectors in the at least one reflector, and wherein the plurality of the reflectors are spliced along the width direction or the height direction, and a total width and a total height of the plurality of the reflectors being spliced are respectively treated as the width and the height of the array of the reflectors.

3. The antenna measurement system according to claim 1, wherein the array of the reflectors presents a reflection parabola in one dimension relative to the array of antennas.

4. The antenna measurement system according to claim 3, wherein a depth value of the array of the reflectors along a depth direction is calculated by the following formula:

$$z = \frac{y^2}{4f_y}$$

wherein z is the depth value, y is a height value of the reflection paraboloid along a height direction and $f_y$ is a focal length between the array of antennas and the reflection paraboloid, and wherein the height direction, the width direction and the depth direction are perpendicular to each other.

5. The antenna measurement system according to claim 3, wherein the measurement surface has a measurement static zone, and a geometric size of the measurement static zone is greater than or equal to one-half of a geometric size of the measurement surface.

6. The antenna measurement system according to claim 3, wherein the measurement surface has a measurement static zone, and a distance between the measurement static zone and the reflection paraboloid is 1.5 to 2.5 times $f_y$.

7. The antenna measurement system according to claim 3, wherein the measurement surface has a measurement static zone, and in the measurement static zone, an amplitude ripple is less than ±0.5 dB and a phase error is less than ±5 degrees.

8. The antenna measurement system according to claim 1, wherein the measurement operation further comprises:
    dividing the reflection parabola into a plurality of blocks to measure respective radiation fields of the plurality of blocks.

9. The antenna measurement system according to claim 1, wherein the radiator comprises a first conductive portion, a second conductive portion, and a third conductive portion; the first conductive portion is composed of a first extension portion, a first curving portion, and a first bending portion; and the second conductive portion is composed of a second extension portion, a second curving portion, and a second bending portion.

* * * * *